United States Patent
Doan et al.

(10) Patent No.: US 9,431,456 B2
(45) Date of Patent: Aug. 30, 2016

(54) IMAGE SENSOR WITH DOPED TRANSFER GATE

(71) Applicant: OMNIVISION TECHNOLOGIES, INC., Santa Clara, CA (US)

(72) Inventors: Hung Q. Doan, Rochester, NY (US); Eric G. Stevens, Webster, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/618,643

(22) Filed: Feb. 10, 2015

(65) Prior Publication Data

US 2015/0179701 A1    Jun. 25, 2015

Related U.S. Application Data

(62) Division of application No. 12/942,517, filed on Nov. 9, 2010, now Pat. No. 9,000,500.

(60) Provisional application No. 61/335,041, filed on Dec. 30, 2009, provisional application No. 61/335,028, filed on Dec. 30, 2009.

(51) Int. Cl.
*H01L 21/70* (2006.01)
*H01L 27/146* (2006.01)
*H01L 27/148* (2006.01)

(52) U.S. Cl.
CPC ... *H01L 27/14689* (2013.01); *H01L 27/14603* (2013.01); *H01L 27/14609* (2013.01); *H01L 27/14612* (2013.01); *H01L 27/14806* (2013.01)

(58) Field of Classification Search
CPC ............... H01L 27/14689; H01L 27/14806; H01L 27/14612; H01L 27/14609; H01L 27/14603

USPC ............................................ 257/292; 438/73
See application file for complete search history.

(56) References Cited

U.S. PATENT DOCUMENTS 5,707,896 A    1/1998  Chiang et al.
6,960,795 B2   11/2005 Rhodes (Continued)

FOREIGN PATENT DOCUMENTS

CN    1992298 A     7/2007
EP    1478028 A2    11/2004

(Continued)

OTHER PUBLICATIONS

TW 099146708—First Taiwan Office Action and Search Report with English Translation, issued Apr. 15, 2015, 12 pages.

(Continued)

*Primary Examiner* — Marc Armand
*Assistant Examiner* — Sue Tang
(74) *Attorney, Agent, or Firm* — Blakely Sokoloff Taylor & Zafman LLP

(57) ABSTRACT

An image sensor is fabricated by forming transfer gates over a substrate layer. A transfer gate is disposed between a respective shared charge-to-voltage conversion region and a photodetector associated with the shared charge-to-voltage conversion region. The transfer gates of each shared charge-to-voltage conversion region are spaced apart to form a conversion region gap. A masking conformal dielectric layer is deposited over the image sensor, covers the transfer gates, fills each conversion region gap, and is etched to form sidewall spacers along an outside edge of each transfer gate with a portion remaining in each conversion region gap and disposed over the substrate layer in each conversion region gap. Source/drain regions are implanted in the substrate layer where an implant region is formed in the transfer gates. The masking conformal dielectric layer in each conversion gap masks the source/drain implant Each charge-to-voltage conversion region is substantially devoid of the implant region.

3 Claims, 11 Drawing Sheets

(56) References Cited

U.S. PATENT DOCUMENTS

| | | | |
|---|---|---|---|
| 7,180,151 B2* | 2/2007 | Park | H01L 27/14603 257/233 |
| 7,338,865 B2 | 3/2008 | Murto et al. | |
| 2003/0211697 A1* | 11/2003 | Hsu | H01L 29/6653 438/305 |
| 2004/0129990 A1* | 7/2004 | Lee | H01L 27/14689 257/428 |
| 2005/0079671 A1 | 4/2005 | Chen et al. | |
| 2005/0148114 A1 | 7/2005 | Rhodes | |
| 2006/0118835 A1 | 6/2006 | Ellis-Monaghan et al. | |
| 2006/0124976 A1 | 6/2006 | Adkisson et al. | |
| 2007/0069260 A1 | 3/2007 | Stevens | |
| 2007/0075337 A1 | 4/2007 | Jung et al. | |
| 2007/0161140 A1* | 7/2007 | Song | H01L 27/14603 438/48 |
| 2008/0128767 A1 | 6/2008 | Adkisson et al. | |
| 2008/0153193 A1 | 6/2008 | Lyu | |
| 2008/0273104 A1 | 11/2008 | Parks et al. | |
| 2009/0121298 A1 | 5/2009 | Furukawa et al. | |
| 2009/0179232 A1 | 7/2009 | Adkisson et al. | |
| 2009/0261393 A1 | 10/2009 | Sze | |
| 2010/0097508 A1 | 4/2010 | Yanagita et al. | |
| 2010/0220227 A1* | 9/2010 | Mizumura | H01L 27/14603 348/308 |
| 2010/0314667 A1 | 12/2010 | Nozaki et al. | |
| 2013/0089945 A1* | 4/2013 | Shinohara | H01L 27/14689 438/73 |

FOREIGN PATENT DOCUMENTS

| | | |
|---|---|---|
| EP | 1675182 A2 | 6/2006 |
| TW | 200830381 A | 7/2008 |
| TW | 200629348 | 8/2008 |
| TW | 200837941 | 9/2008 |
| WO | WO 2010/053557 A2 | 5/2010 |

OTHER PUBLICATIONS

Written Opinion and International Search Report for PCT Application No. PCT/US2010/062118 dated Jun. 28, 2011, 19 pages.
PCT/US2010/062118—International Preliminary Report on Patentability, issued Jul. 4, 2012, 11 pages.
PCT/US2010/062118—Invitation to Pay Additional Fees, mailed Mar. 22, 2011, 5 pages.
Chung-Wei Chang et al., "High Sensitivity of Dielectric Films Structure for Advanced CMOS image Sensor Technology", 2007 International Image Sensor Workshop, pp. 207-210.
CN 201080060139.5—First Chinese Office Action and Search Report, issued Oct. 10, 2014 with English Translation (13 pages).
EP 10801541.3—European Office Action, dated Mar. 4, 2016, 5 pages.

* cited by examiner

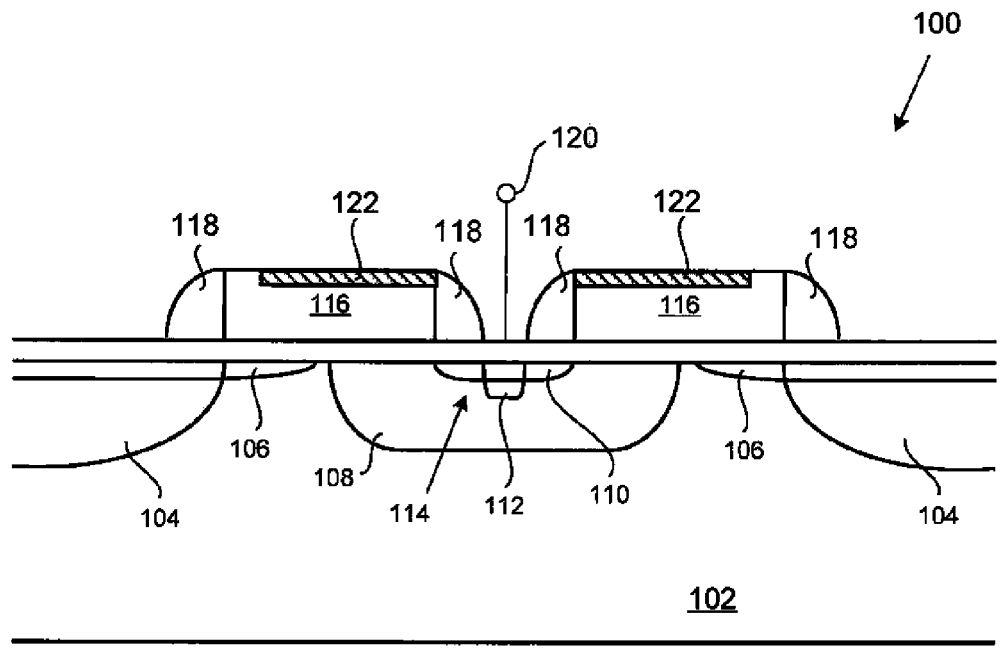
FIG. 1 - Prior Art
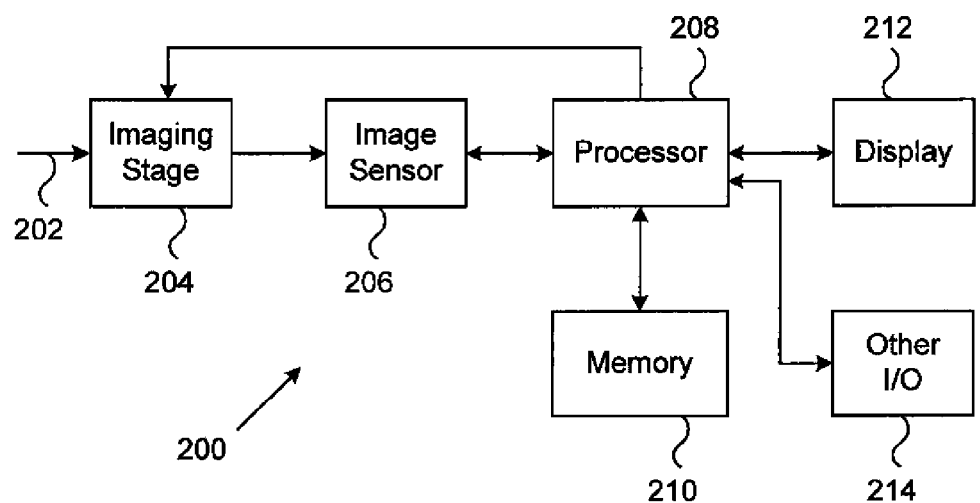
FIG. 2

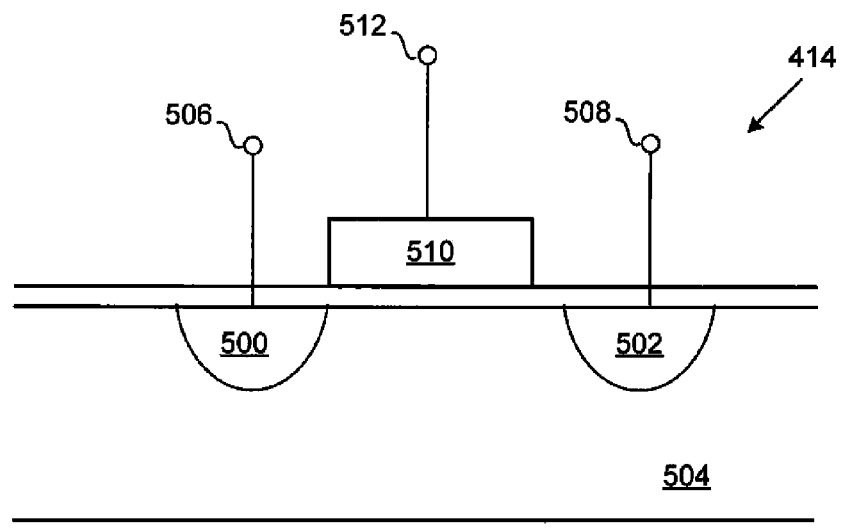
FIG. 5
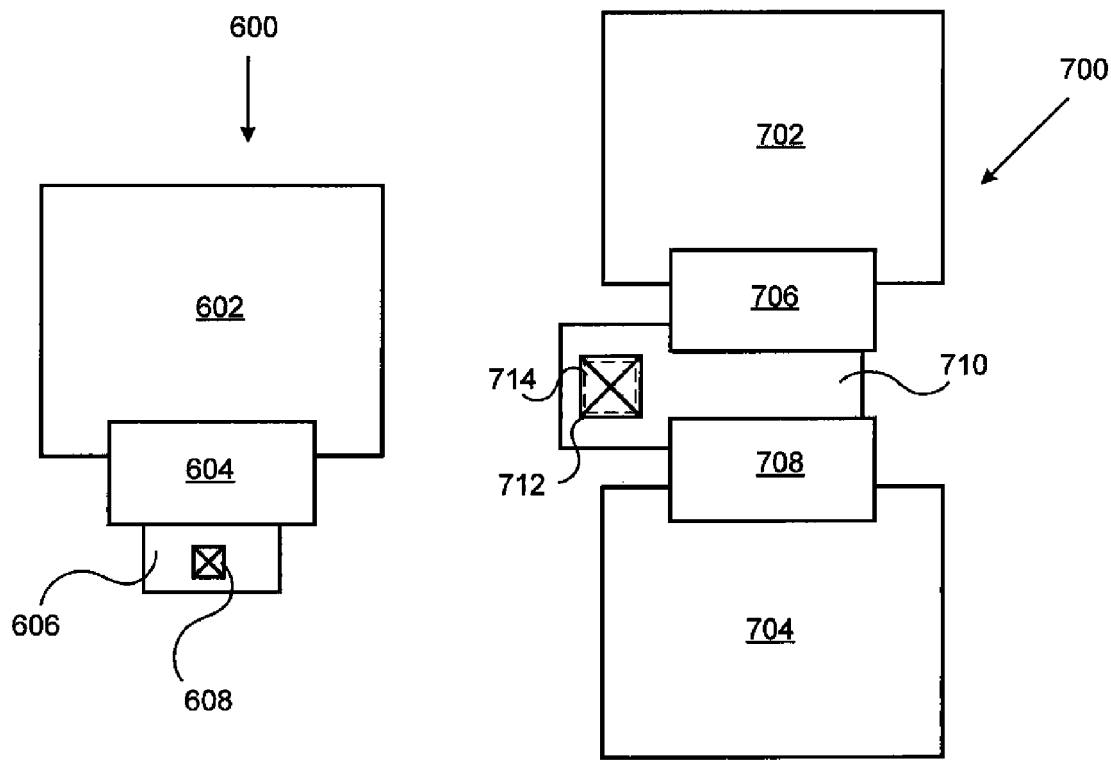
FIG. 6
FIG. 7

IMAGE SENSOR WITH DOPED TRANSFER GATE

CROSS-REFERENCE TO RELATED APPLICATIONS

This application is a divisional of U.S. application Ser. No. 12/942,517, filed Nov. 9, 2010, now pending, which claims the benefit of U.S. Provisional Application No. 61/335,041, filed on Dec. 30, 2009 and U.S. Provisional Application No. 61/335,028 filed Dec. 30, 2009. U.S. application Ser. No. 12/942,517, U.S. Provisional Application No. 61/335,041 and U.S. Provisional Application No. 61/335,028 are hereby incorporated by reference.

TECHNICAL FIELD

The present invention relates generally to image sensors, and more particularly to image sensors having implant regions formed in only a portion of the transfer gates during implantation of source/drain regions.

BACKGROUND

FIG. 1 is a cross-sectional view of a portion of an image sensor according to the prior art. Image sensor 100 includes substrate 102 having photodetectors 104, threshold implant 106, well 108, lightly doped drain (LDD) 110, and heavy source/drain implant region 112 formed therein. The combination of well 108, LDD 110, and source/drain implant region 112 acts as a charge-to-voltage conversion region 114. Well 108 also operates as an anti-punch-through region between the LDD 110 or the source/drain implant region 112 to the photodetector 104.

Threshold implants 106 and well 108 are formed prior to the creation of transfer gates 116, while photodetectors 104 and LDD 110 are formed after the formation of transfer gates 116. Because photodetectors 104 and LDD 110 are created after transfer gates 116, photodetectors 104 and LDD 110 are self-aligned to the edges of transfer gates 116.

Source/drain implant region 112 is implanted into well 108 after sidewall spacers 118 are formed along the outside sides of transfer gates 116. Source/drain implant region 112 is formed when other source/drain implant regions, such as the source/drain implant regions of transistors, are formed in the image sensor. Source/drain implant region 112 is disposed underneath contact 120 and extends out from contact 120 into well 108. At least a portion of each transfer gate 116 is also implanted with dopants during the source/drain implant to form doped region 122. Doped region 122 advantageously affects the transfer gate 116 work function and increases the transfer gate conductivity.

The doping level for the source/drain implant regions, including source-drain implant region 112, is usually high to maintain high conductivity. Because the doping level is so high, the implant completely destroys the lattice structure and converts the single crystalline structure of well 108, LDD 110, and substrate layer 102 into an amorphous structure. Subsequent thermal processing steps are needed for the amorphous structure to rearrange back into a single crystalline structure. As technology advances, however, the post source/drain implant thermal budget is significantly reduced to reduce dopant lateral diffusion, so the implant damage may not be completely repaired by subsequent thermal processing.

One consequence of lattice damage or defects is a very high rate of dark current generation. Lattice damage also serves as a gettering site for metallic contaminants, which is undesirable because metallic contaminants are also known to generate very high dark current. To avoid damaging the substrate, the heavy source/drain implant in the charge-to-voltage conversion region is not performed during the fabrication of some image sensors. However, as described earlier, the heavy source/drain implant forms doped region 122 in transfer gates 116. Removing the doped region 122 will alter the transfer gate 116 work function and may adversely impact the electrical operation of the transfer gate.

SUMMARY

An image sensor includes an array of pixels, with at least one pixel including a photodetector formed in a substrate layer, a transfer gate disposed adjacent to the photodetector, and a charge-to-voltage conversion region disposed adjacent to the transfer gate. The charge-to-voltage conversion region may be produced through the combination of a well and a lightly doped drain (LLD). In one embodiment in accordance with the invention, a single photodetector transfers collected charge to a single charge-to-voltage conversion region. In another embodiment in accordance with the invention, multiple photodetectors transfer collected charge to a common charge-to-voltage conversion region shared by the photodetectors.

An implant region is formed in only a portion of each transfer gate when dopants are implanted into the substrate layer to form source/drain implant regions. The implant region is not formed in the charge-to-voltage regions. Each charge-to-voltage conversion region is substantially devoid of the implant region. Embodiments in accordance with the invention may include a source/drain implant underneath a physical contact to the charge-to-voltage conversion region.

A method for fabricating an image sensor having an array of pixels, with at least one pixel including a photodetector and two or more adjacent pixels sharing a common charge-to-voltage conversion region, includes forming multiple transfer gates over a surface of a substrate layer. A transfer gate is disposed between a respective shared charge-to-voltage conversion region and each photodetector associated with the shared charge-to-voltage conversion region. The transfer gates associated with each shared charge-to-voltage conversion region are spaced apart a predetermined distance to form a conversion region gap. The charge-to-voltage conversion region can be formed with a lightly doped drain (LDD) formed.

A masking conformal dielectric layer is then deposited over the image sensor with the masking conformal dielectric layer covering the transfer gates and filling each conversion region gap. The masking conformal dielectric layer is etched to form sidewall spacers along an outside edge of each transfer gate. After the etch, a portion of the masking conformal dielectric layer remains in each conversion region gap and is disposed over the surface of the substrate layer in each conversion region gap. A heavily doped source/drain implant is the performed to form source/drain implant regions in the image sensor and implant regions in only the transfer gates. The masking conformal dielectric layer in each conversion region gap masks the source/drain implant so that each charge-to-voltage conversion region is substantially devoid of the implant region.

BRIEF DESCRIPTION OF THE DRAWINGS

Embodiments of the invention are better understood with reference to the following drawings. The elements of the drawings are not necessarily to scale relative to each other.

FIG. 1 is a cross-sectional view of a portion of an image sensor according to the prior art;

FIG. 2 is a simplified block diagram of an image capture device in an embodiment in accordance with the invention;

FIG. 5 is a cross-sectional view of row select transistor 414 in an embodiment in accordance with the invention;

FIG. 6 is a simplified block diagram of a top view of a portion of a pixel suitable for use in image sensor 206 in an embodiment in accordance with the invention;

FIG. 7 is a simplified block diagram of a top view of a two-by-two shared pixel arrangement suitable for use in image sensor 206 in an embodiment in accordance with the invention;

DETAILED DESCRIPTION

Figure 3:
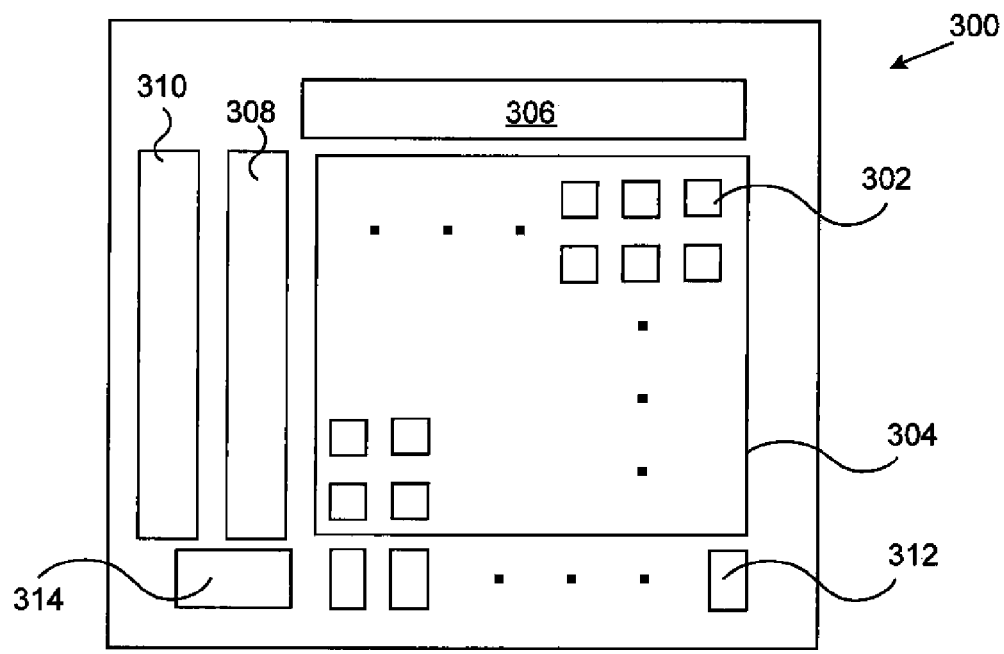
FIG. 3 is a block diagram of a top view of an image sensor suitable for use as image sensor 206 in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one charge packet, current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate layer" is to be understood as a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Referring to the drawings, like numbers indicate like parts throughout the views.

FIG. 2 is a simplified block diagram of an image capture device in an embodiment in accordance with the invention. Image capture device 200 is implemented as a digital camera in FIG. 2. Those skilled in the art will recognize that a digital camera is only one example of an image capture device that can utilize an image sensor incorporating the present invention. Other types of image capture devices, such as, for example, cell phone cameras, scanners, and digital video camcorders can be used with the present invention.

In digital camera 200, light 202 from a subject scene is input to an imaging stage 204. Imaging stage 204 can include conventional elements such as a lens, a neutral density filter, an iris and a shutter. Light 202 is focused by imaging stage 204 to form an image on image sensor 206. Image sensor 206 captures one or more images by converting the incident light into electrical signals. Digital camera 200 further includes processor 208, memory 210, display 212, and one or more additional input/output (I/O) elements 214. Although shown as separate elements in the embodiment of FIG. 2, imaging stage 204 may be integrated with image sensor 206, and possibly one or more additional elements of digital camera 200, to form a camera module. For example, a processor or a memory may be integrated with image sensor 206 in a camera module in embodiments in accordance with the invention.

Processor 208 may be implemented, for example, as a microprocessor, a central processing unit (CPU), an application-specific integrated circuit (ASIC), a digital signal processor (DSP), or other processing device, or combinations of multiple such devices. Various elements of imaging stage 204 and image sensor 206 may be controlled by timing signals or other signals supplied from processor 208.

Memory 210 may be configured as any type of memory, such as, for example, random access memory (RAM), read-only memory (ROM), Flash memory, disk-based memory, removable memory, or other types of storage elements, in any combination. A given image captured by image sensor 206 may be stored by processor 208 in memory 210 and presented on display 212. Display 212 is typically an active matrix color liquid crystal display (LCD), although other types of displays may be used. The additional I/O elements 214 may include, for example, various on-screen controls, buttons or other user interfaces, network interfaces, or memory card interfaces.

It is to be appreciated that the digital camera shown in FIG. 2 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Referring now to FIG. 3, there is shown a block diagram of a top view of an image sensor suitable for use as image sensor 206 in an embodiment in accordance with the invention. Image sensor 300 includes multiple pixels 302 typically arranged in rows and columns that form an imaging area 304. Each pixel 302 includes a photosensitive region (not shown) in an embodiment in accordance with the invention.

Image sensor 300 further includes column decoder 306, row decoder 308, digital logic 310, multiple analog or digital output circuits 312, and timing generator 314. Each column of pixels in imaging area 304 is electrically connected to an output circuit 312. Timing generator 314 can be used to generate the signals used to operate image sensor 300, including the signals needed to read out signals from imaging area 304.

Image sensor 300 is implemented as an x-y addressable image sensor, such as, for example, a Complementary Metal Oxide Semiconductor (CMOS) image sensor, in an embodiment in accordance with the invention. Thus, column decoder 306, row decoder 308, digital logic 310, analog or digital output channels 312, and timing generator 314 are implemented as standard CMOS electronic circuits that are operatively connected to imaging area 304.

Functionality associated with the sampling and readout of imaging area 304 and the processing of corresponding image data may be implemented at least in part in the form of software that is stored in memory 210 (see FIG. 2) and executed by processor 208. Portions of the sampling and readout circuitry may be arranged external to image sensor 300, or formed integrally with imaging area 304, for example, on a common integrated circuit with photodetectors and other elements of the imaging area. Those skilled in the art will recognize that other peripheral circuitry configurations or architectures can be implemented in other embodiments in accordance with the invention.

Figure 4:
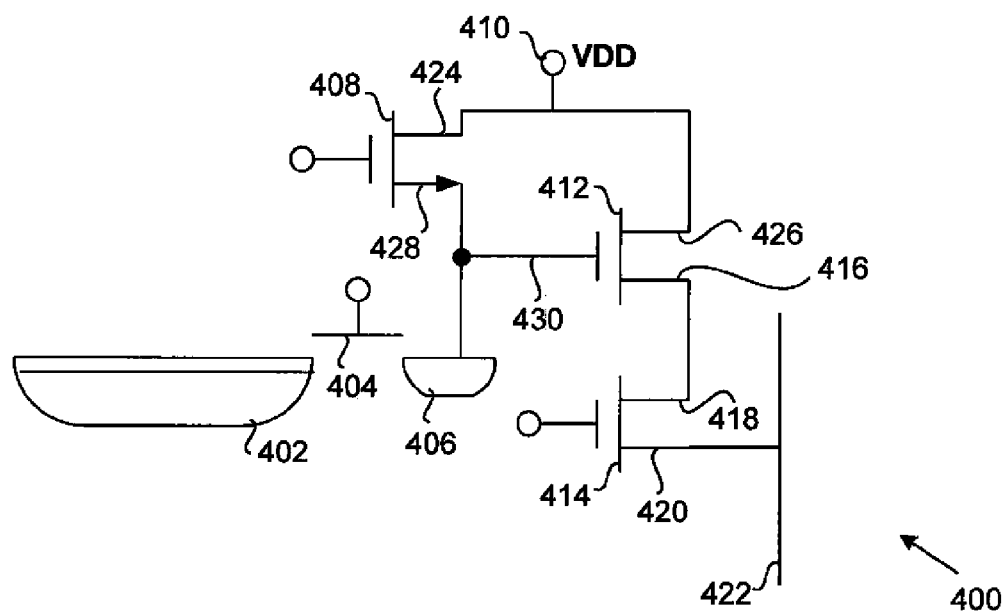
FIG. 4 is a schematic diagram of an active pixel suitable for use as pixel 302 in an embodiment in accordance with the invention.

Referring now to FIG. 4, there is shown a schematic diagram of an active pixel suitable for use as pixel 302 in an embodiment in accordance with the invention. Active pixel 400 includes photodetector 402, transfer gate 404, charge-to-voltage conversion mechanism 406, reset transistor 408, potential VDD 410, amplifier transistor 412, and row select transistor 414. Reset transistor 408, amplifier transistor 412, and row select transistor 414 are implemented as field effect transistors in an embodiment in accordance with the invention. Source/drain terminal 416 of row select transistor 414 is connected to source/drain terminal 418 of amplifier transistor 412 while source/drain terminal 420 is connected to output 422. Source/drain terminal 424 of reset transistor 408 and source/drain terminal 426 of amplifier transistor 414 are connected to potential VDD 410. Source/drain terminal 428 of reset transistor 408 and gate 430 of amplifier transistor 412 are connected to charge-to-voltage conversion mechanism 406.

FIG. 5 is a cross-sectional view of row select transistor 414 in an embodiment in accordance with the invention. Source/drain implant regions 500, 502 are formed in substrate layer 504 during a source/drain implantation process. Source/drain implant region 500 and contact 506 form one source/drain terminal (418 or 420) of row select transistor 414 while source/drain implant region 502 and contact 508 form the other source/drain terminal (420 or 418) of row select transistor 414. Electrode 510 is formed between source/drain implant regions 500, 502. Electrode 510 and contact 512 form the gate of row select transistor 414. Other transistors in an image sensor include source/drain implant regions that are formed during the source/drain implantation.

Embodiments of the present invention produce at least one implant region in a portion of an upper surface of a transfer gate when the dopant or dopants are implanted into substrate layer 504 to form source/drain implant regions in an image sensor (such as source/drain implant regions 500, 502). Dopant implantation for the source/drain regions does not produce the implant region in the charge-to-voltage conversion regions. The charge-to-voltage conversion regions remain substantially devoid of the implant regions. Note that in some embodiments in accordance with the invention, the charge-to-voltage conversion regions may include an implant region underneath a contact to a charge-to-voltage conversion region (see e.g., implant region 714 under contact 712 in FIG. 7). This contact implant region can be produced during a dopant implant for the source/drain regions by patterning a masking layer to define an opening where each contact region will be formed while masking the areas of the charge-to-voltage conversion regions not having the contact. The implant region under the contact does not extent substantially outside of the area used for the contact. One advantage to including a source/drain implant region underneath the contact is the implant region can reduce contact resistance.

Thus, as used herein, the term "implant region" is defined as the region formed in a transfer gate when the dopant or dopants are implanted into the substrate layer to form source/drain implant regions in an image sensor. Referring now to FIG. 6, there is shown a simplified block diagram of a top view of a portion of a pixel suitable for use in image sensor 206 in an embodiment in accordance with the invention. Pixel 600 includes photodetector 602, transfer gate 604, and charge-to-voltage conversion region 606. Charge-to-voltage conversion region 606 includes contact 608. Photodetector 602 is implemented as a photodiode or pinned photodiode and charge-to-voltage conversion region 606 as a floating diffusion in an embodiment in accordance with the invention.

As discussed earlier, pixel 600 can also include a reset transistor and an amplifier transistor (not shown) connected to the charge-to-voltage conversion region through contact 608. Pixel 600 can further include a row select transistor (not shown) connected to the amplifier transistor. These components are well known in the art and are therefore not shown in FIG. 6 for the sake of simplicity and ease of understanding.

Photodetector 602 collects and stores charge generated by incident light. When a bias voltage is applied to transfer gate 604, the collected charge packet is transferred from photodetector 602 to charge-to-voltage conversion region 606. The amplifier transistor (not shown), such as a source-follower transistor, connected to the charge-to-voltage conversion region 606 through contact 608 converts the charge packet to a voltage signal representing the amount of charge on charge-to-voltage conversion region 606. The voltage signal is then transferred to a column output line by the amplifier transistor.

FIG. 7 is a simplified block diagram of a top view of a two-by-one shared pixel arrangement suitable for use in image sensor 206 in an embodiment in accordance with the invention. Pixel arrangement 700 includes two photodetectors 702, 704, a transfer gate 706, 708 adjacent each photodetector 702, 704, respectively, and a common charge-tovoltage conversion region 710 shared by the two photodetectors 702, 704. Common charge-to-voltage conversion region 710 includes contact 712. Typically, photodetector 702 is disposed in one row (or column) of pixels in a pixel array and photodetector 704 is positioned in an adjacent row (or column) of pixels in the pixel array.

A bias voltage is selectively applied to transfer gates 706, 708 to selectively and respectively transfer the collected charge packet from photodetectors 702, 704 to charge-to-voltage conversion region 710. An amplifier transistor (not shown) connected to the charge-to-voltage conversion region 710 through contact 712 converts each charge packet to a voltage signal representing the amount of charge on charge-to-voltage conversion region 710. The voltage signal is then transferred to a column output line by an amplifier transistor.

A source/drain contact implant region 714 is disposed under contact 712 in an embodiment in accordance with the invention. Source/drain contact implant region 714 is formed during a dopant implantation for the source/drain regions. Source/drain contact implant region 714 can be produced by patterning a masking layer to define an opening where contact 712 will be formed while masking the areas of charge-to-voltage conversion region 710 not covered by contact 712. Source/drain contact implant region 714 does not extent substantially outside of the area used for contact 712.

Figure 8:
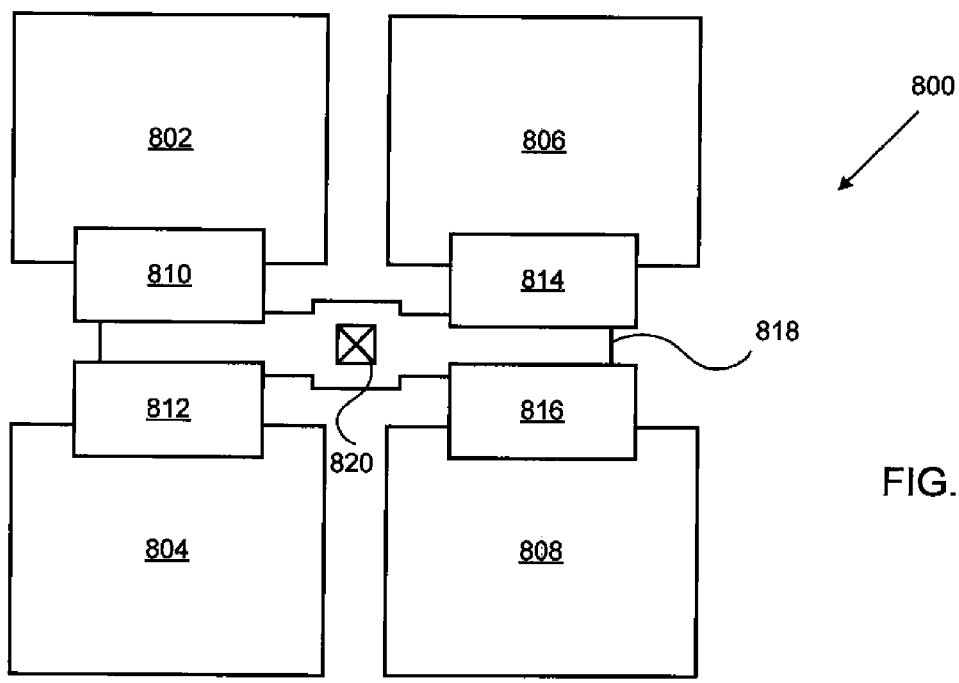
FIG. 8 is a simplified block diagram of a top view of a two-by-two shared pixel arrangement suitable for use in image sensor 206 in an embodiment in accordance with the invention.

Referring now to FIG. 8, there is shown a simplified block diagram of a top view of a two-by-two shared pixel arrangement suitable for use in image sensor 206 in an embodiment in accordance with the invention. Pixel arrangement 800 includes four photodetectors 802, 804, 806, 808, transfer gates 810, 812, 814, 816 adjacent respective photodetectors 802, 804, 806, 808, and a common charge-to-voltage conversion region 818 shared by the four photodetectors 802, 804, 806, 808. Common charge-to-voltage conversion region 818 includes contact 820. Typically, photodetectors 802, 806 are disposed in one row (or column) of pixels in a pixel array and photodetectors 804, 808 are positioned in an adjacent row (or column) of pixels in the pixel array.

A bias voltage is selectively applied to transfer gates 810, 812, 814, 816 to selectively and respectively transfer the collected charge packets from photodetectors 802, 804, 806, 808 to charge-to-voltage conversion region 818. An amplifier transistor (not shown) connected to the charge-to-voltage conversion region 818 through contact 820 converts each charge packet to a voltage signal representing the amount of charge on charge-to-voltage conversion region 818. The voltage signal is then transferred to a column output line by an amplifier transistor.

Although two-by-one and two-by-two arrangements have been described, other embodiments in accordance with the invention are not limited to these pixel arrangements. Different pixel arrangements can be used with the present invention. By way of example only, pixel arrangements such as three-by-two and four-by-two can be used in other embodiments in accordance with the invention. Additionally, a pixel array is not limited to a row and column configuration. A pixel array can be arranged in any desired pattern, such as, for example, a hexagonal pattern.

Figure 9:
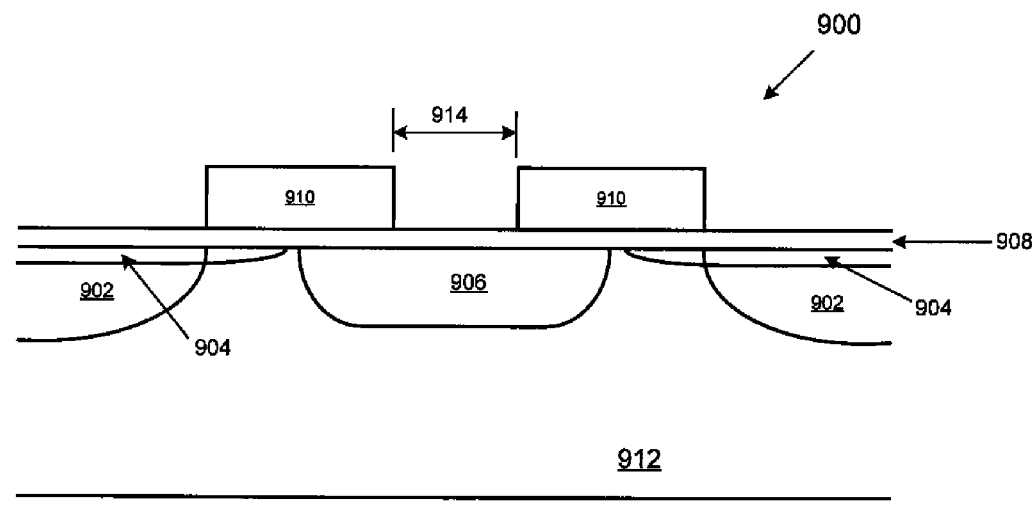
FIGS. 9-15 are cross-sectional views of a portion of an image sensor that are used to depict a first method for forming implant regions only in a portion of the transfer gates during implantation of source/drain regions in an embodiment in accordance with the invention.

FIGS. 9-15 are cross-sectional views of a portion of an image sensor that are used to depict a first method for forming implant regions only in a portion of the transfer gates during implantation of source/drain regions in an embodiment in accordance with the invention. Initially, as shown in FIG. 9, the structure of image sensor 900 has been processed to a stage where photodetectors 902, threshold implant 904, well 906, pad oxide 908, and transfer gates 910 have been formed in or on substrate layer 912. The space 914 between transfer gates 910 is herein referred to as a conversion region gap 91499.

Threshold implant 904, well 906, and substrate layer 912 have a first conductivity type while photodetectors 902 have a second conductivity type opposite to the first conductivity type. By way of example only, threshold implant 904, well 906, and substrate layer 912 have an n conductivity type while photodetectors 902 have a p conductivity type.

Figure 10:
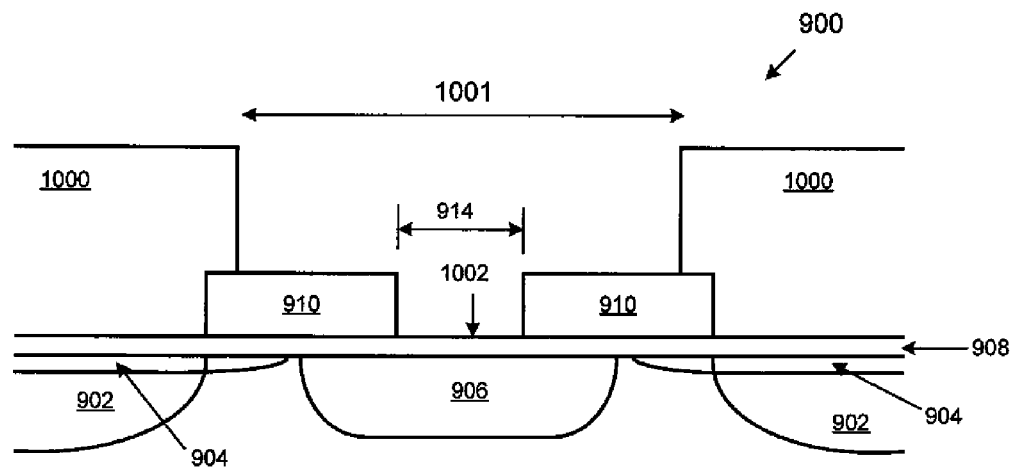

Next, as shown in FIG. 10, a masking layer 1000, such as a photoresist layer, is deposited over image sensor 900 and patterned to form opening 1001. Opening 1001 exposes a portion of each transfer gate 910 and the surface 1002 of substrate layer 912 in conversion region gap 914.

Figure 11:
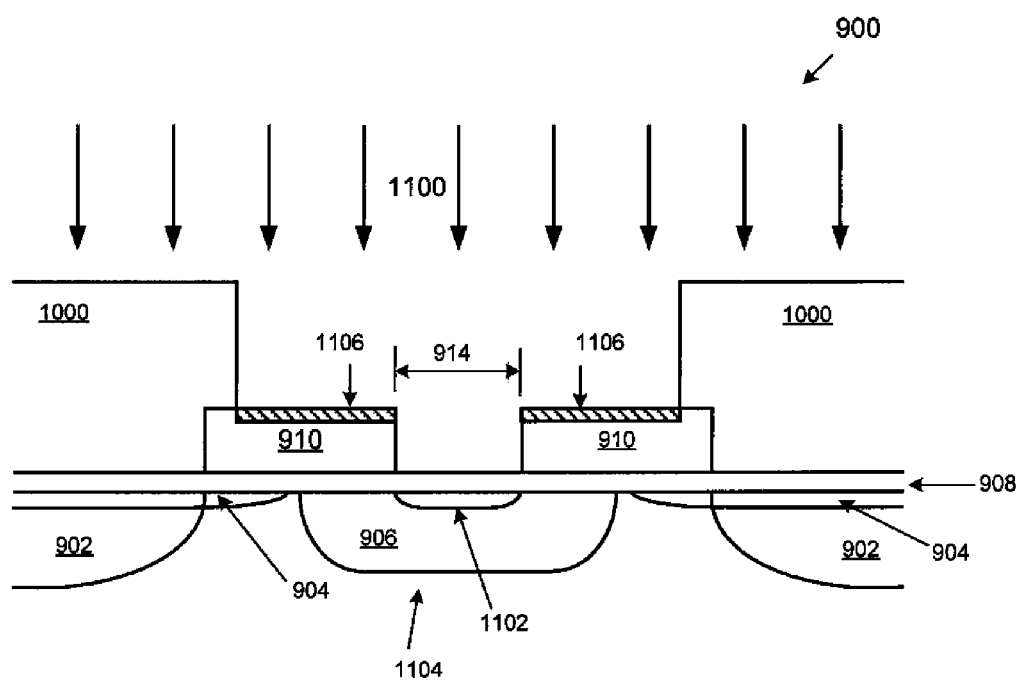

One or more dopants is then implanted (represented by arrows 1100) through opening 1001 and into the surface 1002 to form a lightly doped drain (LDD) 1102 in well 906 (FIG. 11). Combined LDD 1102 and well 906 act as a charge-to-voltage conversion region 1104. The LDD 1102 has the opposite conductivity type to well 906 in an embodiment in accordance with the invention. Implanting the dopants into well 906 to form LDD 1102 also forms a doped region 1106 in a portion of the upper region of each transfer gate 910.

Figure 12:
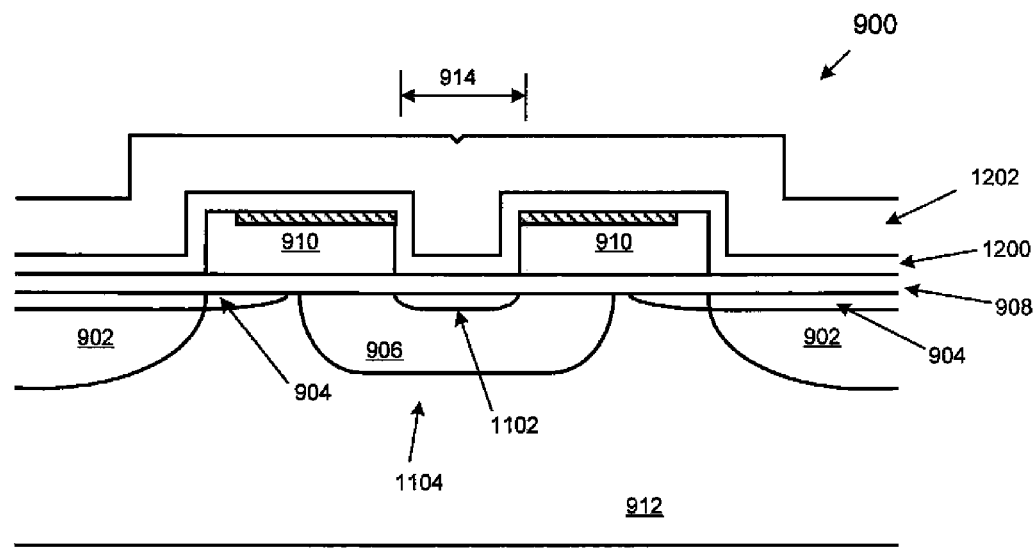

Masking layer 1000 is then removed and conformal dielectric layer 1200 deposited over image sensor 900 (FIG. 12). A masking conformal dielectric layer 1202 is deposited over conformal dielectric layer 1200. Conformal dielectric layer 1200 is implemented as a nitride layer and masking conformal dielectric layer 1202 as an oxide layer in an embodiment in accordance with the invention. Other embodiments in accordance with the invention can use different materials for conformal dielectric layer 1200 and masking conformal dielectric layer 1202. For example, any combination of a nitride/oxide, oxide/oxide, nitride/nitride, or oxide/nitride can be used.

The thickness of masking conformal dielectric layer 1202 is chosen to be sufficiently thick so that it fills, or fills the bottom portion, of conversion region gap 914 after a subsequent etching process is performed. By way of example only, the thickness of masking conformal dielectric layer 1202 is at least half the distance between transfer gates 910 or conversion region gap 914. Masking conformal dielectric layer 1202 can be deposited to a different thickness in other embodiments in accordance with the invention.

Conversion region gap 914 is designed to a minimum distance in one embodiment to ensure conversion region gap 914 is filled by conformal dielectric layer 1202. Constructing conversion region gap 914 at its minimum width also reduces the capacitance of the charge-to-voltage conversion region, which increases the pixel conversion gain.

Figure 13:
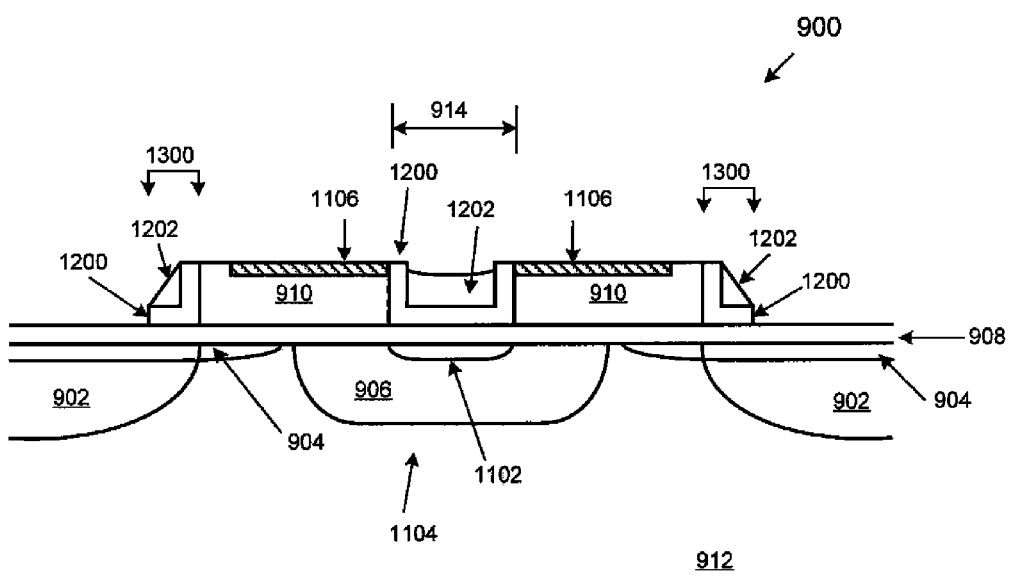

Masking conformal dielectric layer 1202 and conformal dielectric layer 1200 are then etched to expose a top surface of transfer gates 910 (FIG. 13). By way of example only, masking conformal dielectric layer 1202 and conformal dielectric layer 1200 are etched anisotropically in the vertical direction with a reactive ion etch or plasma etch in an embodiment in accordance with the invention.

The etch forms sidewall spacers 1300 along the outside sides or edges of transfer gates 910 (the sides opposite conversion region gap 914). Conformal dielectric layer 1200 covers the inside edges of transfer gates 910 and the surface of substrate 912. The etch also results in masking conformal dielectric layer 1202 filling, or completely filling a bottom portion of the remaining portion of conversion region gap 914 not filled with conformal dielectric layer 1200.

Figure 14:
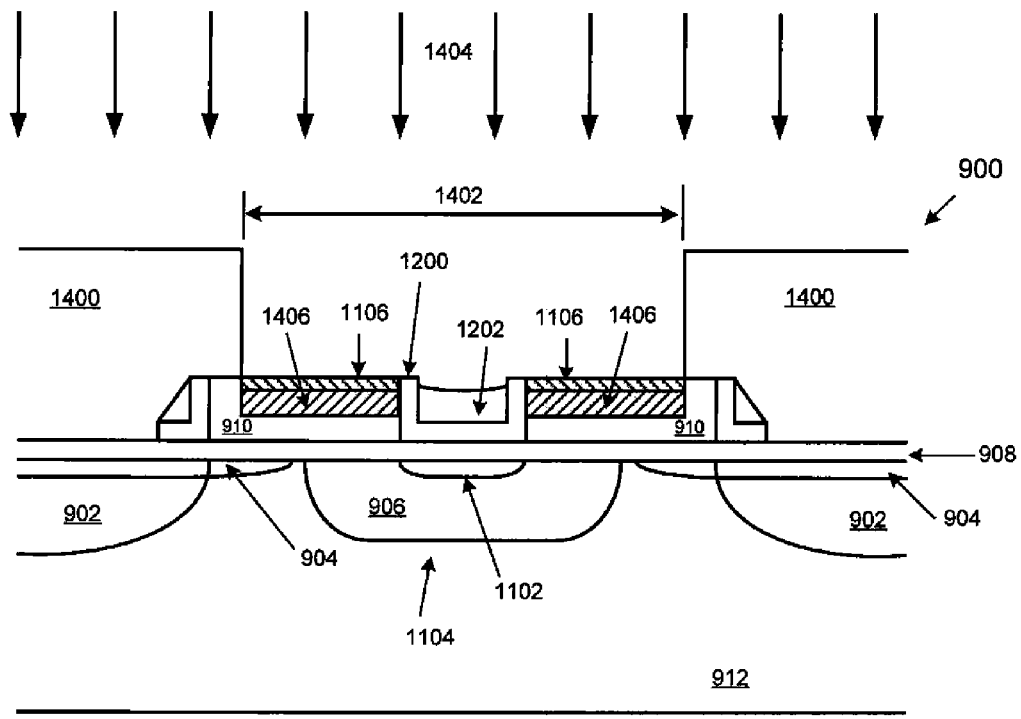

Next, as shown in FIG. 14, a masking layer 1400 is deposited over image sensor 900 and patterned to form opening 1402, which exposes a portion of the upper region of each transfer gate 910, conformal dielectric layer 1200 and masking conformal dielectric layer 1202 in conversion region gap 914. One or more dopants are implanted (represented by arrows 1404) through opening 1402 and into a portion of transfer gates 910 during a source/drain implant process to form source/drain implant regions (not shown) in image sensor 900 and implant region 1406 in transfer gates 910. Implant region 1406 has the opposite conductivity type as well 906 in an embodiment in accordance with the invention. Masking conformal dielectric layer 1202 acts as a mask during the implant 1404 and prevents the dopants in implant 1404 from implanting into charge-to-voltage conversion region 1104.

Figure 15:
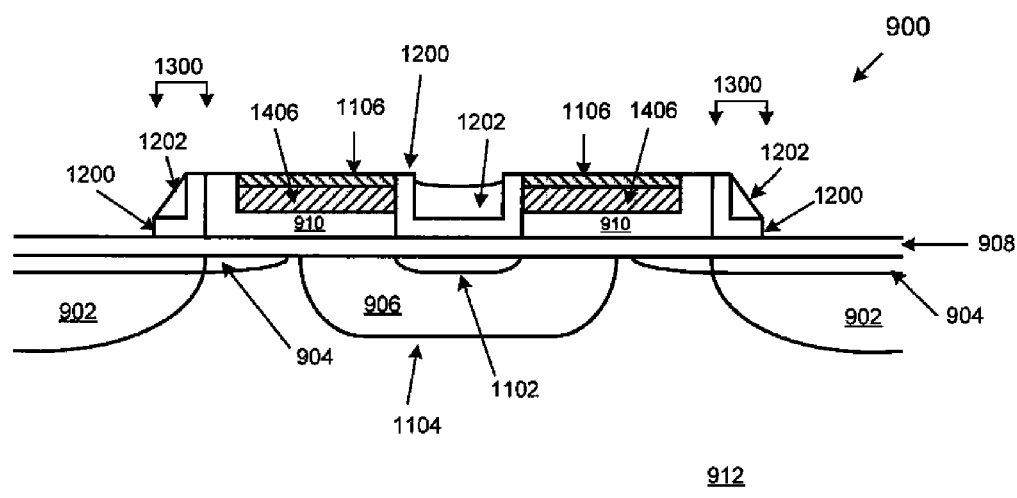
Figure 16:
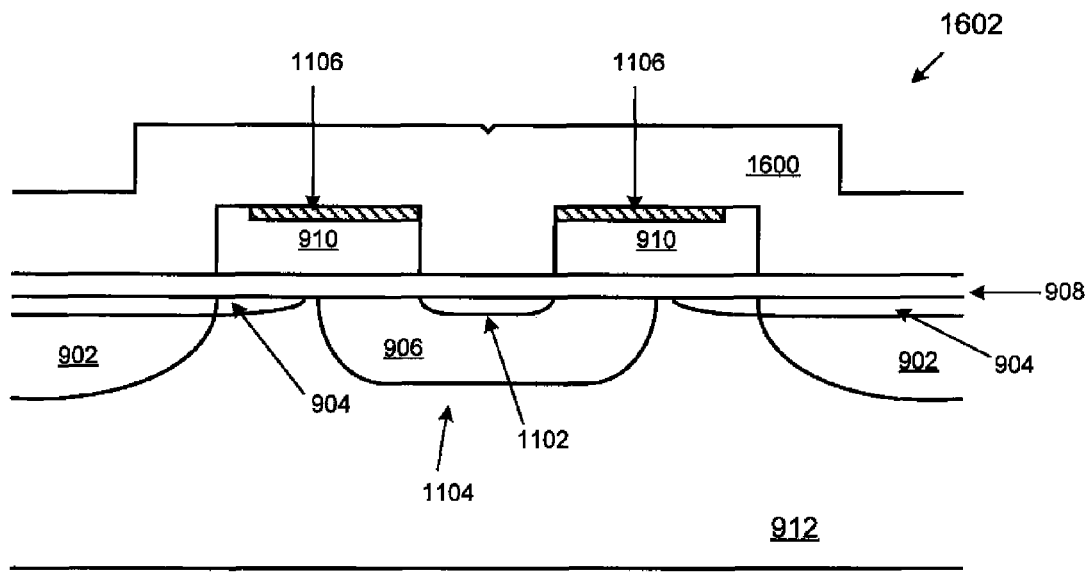
FIGS. 16-19 are cross-sectional views of a portion of an image sensor that are used to illustrate a second method for forming implant regions only in a portion of the transfer gates during implantation of source/drain regions in an embodiment in accordance with the invention.

The masking layer 1400 is then removed, as shown in FIG. 15. As shown in FIG. 15, image sensor 900 includes implant regions 1406 only in transfer gates 910. Charge-to-voltage conversion region 1104 (well 906 and LDD 1102) is substantially devoid of an implant region. Image sensor 900 can now be processed further to complete the fabrication of image sensor 900. Such fabrication processes are well known in the art and are therefore not described in detail herein.

FIGS. 16-19 are cross-sectional views of a portion of an image sensor that are used to illustrate a second method for forming implant regions only in a portion of the transfer gates during implantation of source/drain regions in an embodiment in accordance with the invention. The processing techniques shown in FIGS. 16-19 substitute for the fabrication steps depicted in FIGS. 12-15. The process shown in FIG. 16 follows immediately after the process illustrated in FIG. 11. Masking conformal dielectric layer 1600 is deposited over image sensor 1602. The thickness of masking conformal dielectric layer 1600 is chosen to be sufficiently thick so that it fills, or completely fills the bottom portion, of conversion region gap 914 after a subsequent etching process is performed. Masking conformal dielectric layer 1600 is implemented as a nitride layer in an embodiment in accordance with the invention. Masking conformal dielectric layer 1600 can be made of a different material in other embodiments in accordance with the invention. For example, silicon dioxide, silicon nitride, hafnium oxide, or any type of dielectric film can be used.

Figure 17:
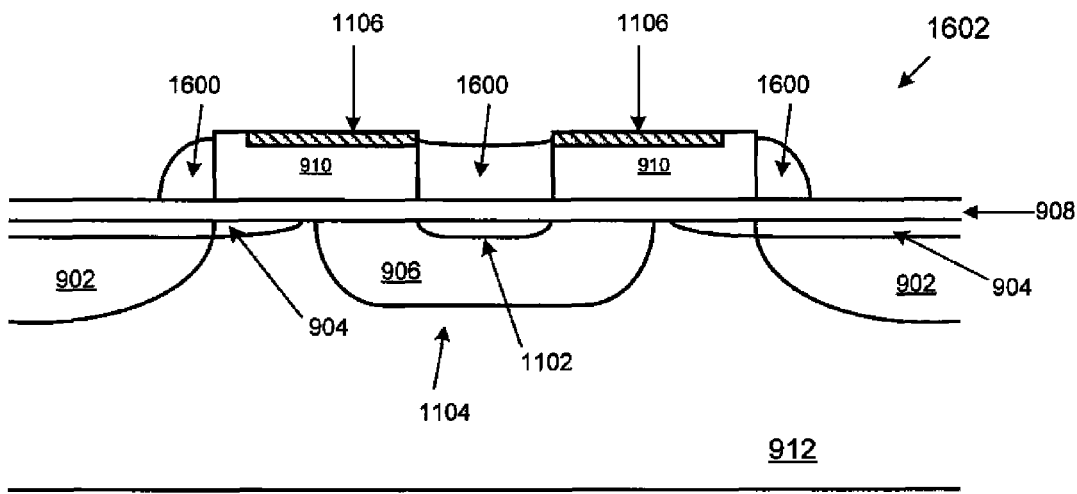

Next, as shown in FIG. 17, masking conformal dielectric layer 1600 is etched to expose the upper surface of transfer gates 910. The etch results in the conformal dielectric layer 1600 forming sidewall spacers along the outside sides of transfer gates 910 and filling, or completely filling a bottom portion of, the conversion region gap 914.

Figure 18:
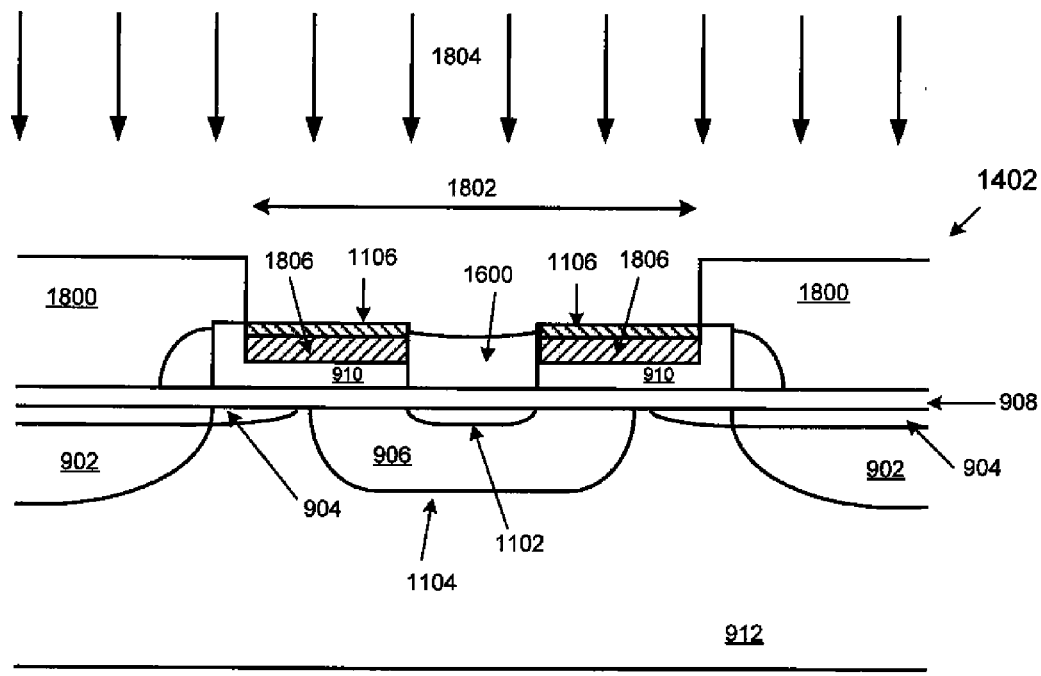

A resist layer 1800 is then deposited over image sensor 1602 and patterned to form opening 1802. One example of a resist layer 1800 is a photoresist layer. Opening 1802 exposes a top surface of masking conformal dielectric layer 1600 in conversion region gap 914 and a portion of a top surface of each transfer gate 910 (FIG. 18). One or more dopants are implanted (represented by arrows 1804) through opening 1802 and into a portion of transfer gates 910 during a source/drain implant process to form source/drain implant regions (not shown) in the image sensor 1602 and implant regions 1806 in transfer gates 910. Implant regions 1806 have the opposite conductivity type as the well 906 in an embodiment in accordance with the invention. Masking conformal dielectric layer 1600 acts as a mask during the implant 1804 and prevents the dopants in implant 1804 from implanting into charge-to-voltage conversion region 1104 (well 906 and LDD 1102).

Figure 19:
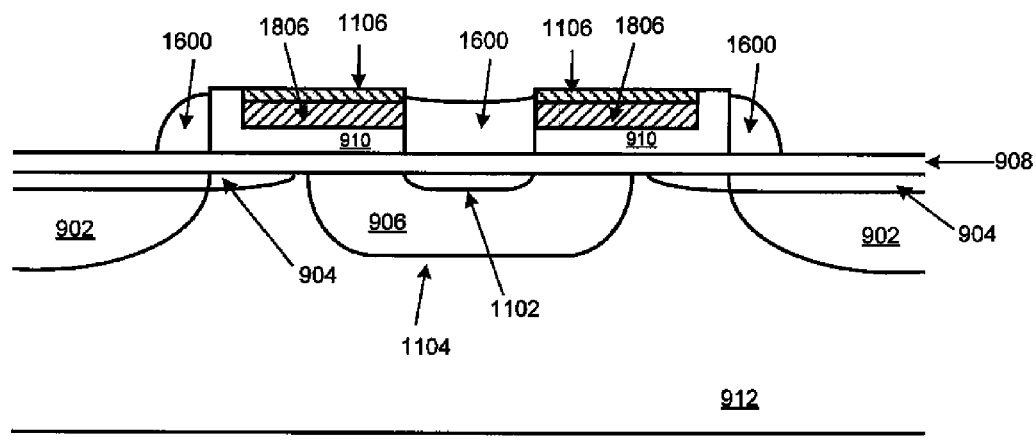

Masking layer 1800 is then removed, as shown in FIG. 19. As shown in FIG. 19, image sensor 1602 includes implant regions 1806 only in transfer gates 910. Charge-to-voltage conversion region 1104 is substantially devoid of an implant region. Image sensor 1602 can now be processed further to complete the fabrication of image sensor 1602. Such fabrication processes are well known in the art and are therefore not described in detail herein.

Figure 20:
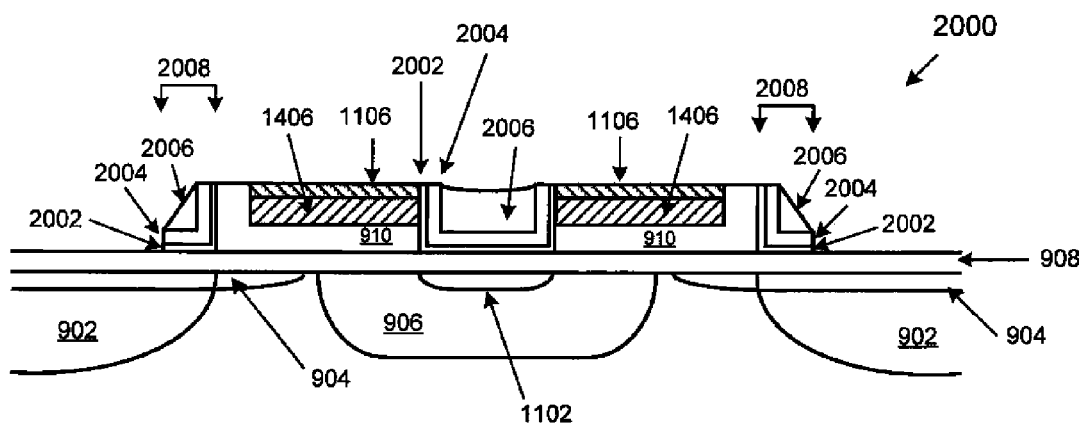
FIG. 20 is cross-sectional view of a portion of an image sensor fabricated with a third method for forming implant regions only in a portion of the transfer gates during implantation of source/drain regions in an embodiment in accordance with the invention.

Referring now to FIG. 20, there is shown a cross-sectional view of a portion of an image sensor fabricated with a third method for implant regions only in a portion of the transfer gates during implantation of source/drain regions in an embodiment in accordance with the invention. Image sensor 2000 in FIG. 20 differs from image sensor 900 in FIG. 15 in that two conformal dielectric layers 2002, 2004 are deposited over image sensor 2000 before masking conformal dielectric layer 2006 is deposited over image sensor 2000. The two conformal dielectric layers 2002, 2004 and masking conformal dielectric layer 2006 are shown in sidewall spacers 2008 and filling conversion region gap 914.

Conformal dielectric layer 2002 is implemented as an oxide layer, conformal dielectric layer 2004 as a nitride layer, and masking conformal dielectric layer 2006 as an oxide layer in an embodiment in accordance with the invention. The dielectric layers 2002, 2004, and 2006 can be made of any combination of insulator such as oxide/nitride/oxide or oxide/nitride/nitride or oxide/oxide/nitride or any other dielectric materials in other embodiments in accordance with the invention.

Image sensor 2000 is formed by following the processes depicted in FIGS. 12-15, except that in the step shown in FIG. 12, conformal dielectric layer 2002 is first deposited over image sensor 2000, conformal dielectric layer 2004 is then deposited over conformal dielectric layer 2002, and masking conformal dielectric layer 2006 is deposited over conformal dielectric layer 2004. Image sensor 2000 is then processed using the fabrication steps shown in FIGS. 13 and 14 to produce the structure illustrated in FIG. 20.

Figure 21:
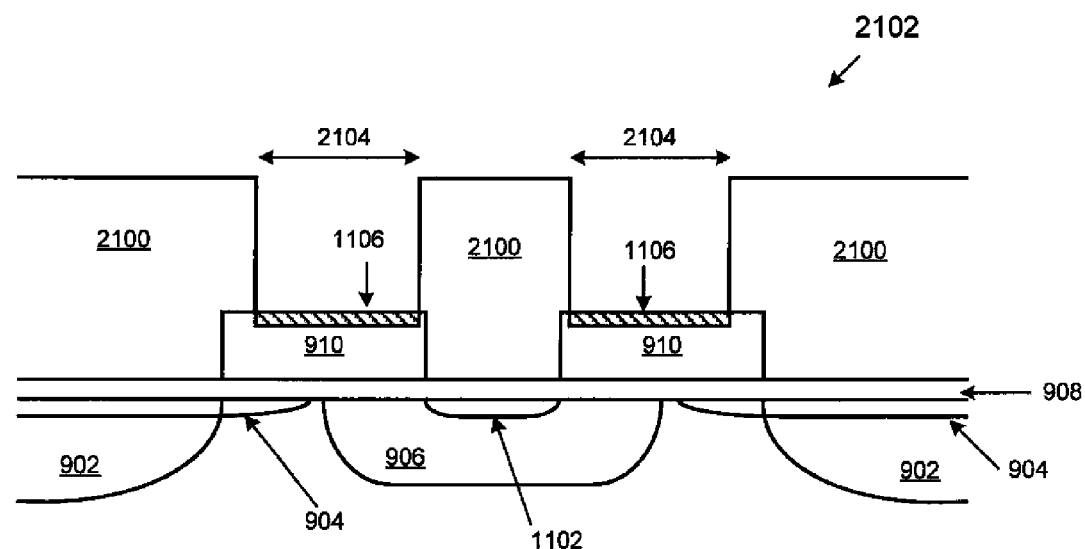
FIGS. 21-23 are cross-sectional views of a portion of an image sensor that are used to illustrate a fourth method for forming implant regions only in a portion of the transfer gates during implantation of source/drain regions in an embodiment in accordance with the invention.
Figure 22:
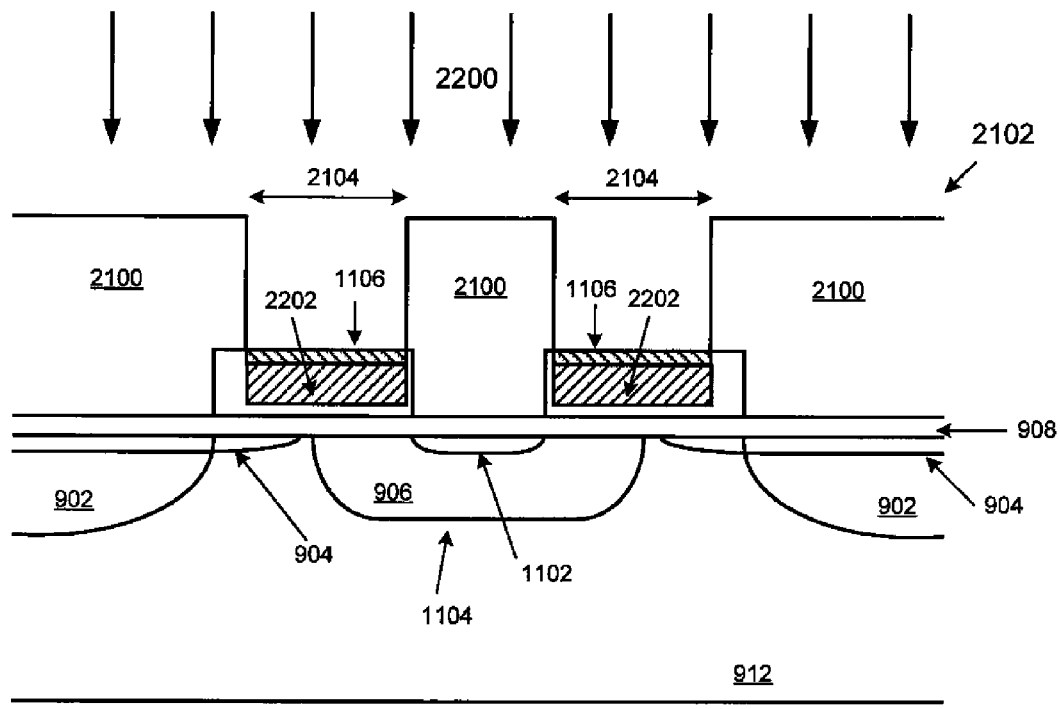
Figure 23:
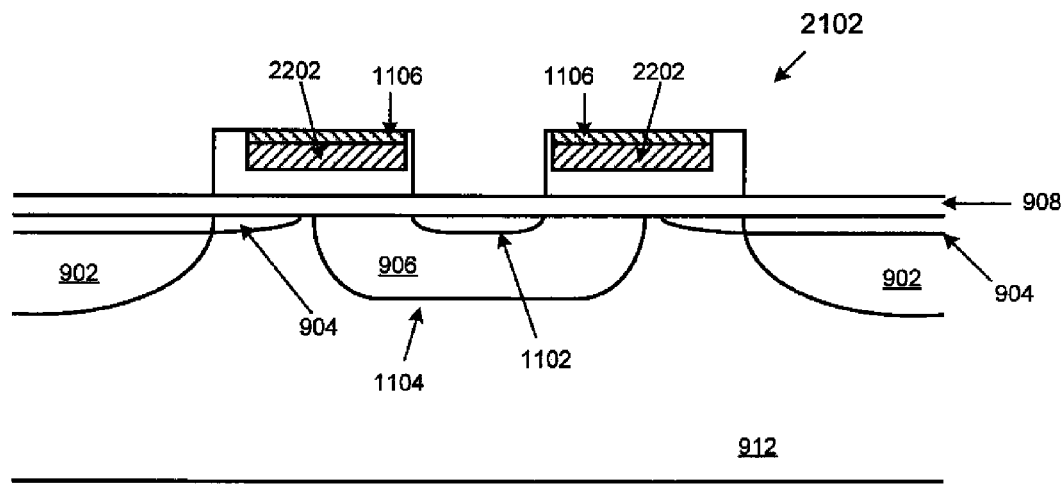

FIGS. 21-23 are cross-sectional views of a portion of an image sensor that are used to illustrate a fourth method for forming implant regions only in a portion of the transfer gates during implantation of source/drain regions in an embodiment in accordance with the invention. The processing step of FIG. 21 follows immediately after FIG. 11. A masking layer 2100, such as a photoresist layer, is deposited over image sensor 2102 and patterned to form openings 2104. Openings 2104 expose a portion of the top surface of transfer gates 910. Masking layer 2100 is patterned using a technique that is able to pattern more finely and to very small dimensions. By way of example only, masking layer 2100 is patterned using deep ultraviolet (DUV) lithography, Extreme UV (EUV) lithography, immersion lithography, or x-ray lithography in an embodiment in accordance with the invention.

Next, as shown in FIG. 22, one or more dopants is implanted (represented by arrows 2200) through openings 2104 and into a portion of transfer gates 910 during a source/drain implant process to form source/drain implant regions (not shown) in image sensor 2102 and implant regions 2202 in transfer gates 910. Implant regions 2202 have the opposite conductivity type as well 906 in an embodiment in accordance with the invention. The portion of masking layer 2100 disposed between transfer gates 910

(in conversion region gap 914) prevents implant 2200 from implanting into charge-to-voltage conversion region 1104 (well 906 and LDD 1102).

The masking layer 2100 is then removed, as shown in FIG. 23. As shown in FIG. 23, image sensor 2102 includes implant regions 2202 only in transfer gates 910. Charge-to-voltage conversion region 1104 is substantially devoid of an implant region. Image sensor 2102 can now be processed further to complete the fabrication of image sensor 2102. Such fabrication processes are well known in the art and are therefore not described in detail herein.

Advantages to the present invention include the formation of implant regions in the transfer gates but not in the charge-to-voltage conversion regions when the source/drain regions are formed in an image sensor. Preventing the heavy doped source/drain implant from implanting into the charge-to-voltage conversion region increases the charge-to-voltage conversion gain or sensitivity. It also eliminates the formation of lattice defects caused by the heavy source/drain implant and reduces dark current in this region.

The invention has been described in detail with particular reference to certain preferred embodiments thereof, but it will be understood that variations and modifications can be effected within the spirit and scope of the invention. For example, a source/drain contact implant region is shown in the embodiment illustrated in FIG. 7. Other embodiments in accordance with the invention can include a source/drain contact implant region. Additionally, some of the components included in a pixel can differ from the components shown in FIG. 4. Some components can be eliminated or additional components can be included or shared by more than one pixel.

Even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
102 substrate
104 photodetector
106 threshold implant
108 well
110 lightly doped drain
112 source/drain implant region
114 charge-to-voltage conversion region
116 transfer gate
118 sidewall spacers
120 contact
122 doped region in transfer gates
200 image capture device
202 light
204 imaging stage
206 image sensor
208 processor
210 memory
212 display
214 other input/output (I/O) elements
300 image sensor
302 pixel
304 imaging area
306 column decoder
308 row decoder
310 digital logic
312 multiple analog or digital output circuits
314 timing generator
400 pixel
402 photodetector
404 transfer gate
406 charge-to-voltage conversion region
408 reset transistor
410 potential
412 amplifier transistor
414 row select transistor
416 source/drain terminal
418 source/drain terminal
420 source/drain terminal
422 output
424 source/drain terminal
426 source/drain terminal
428 source/drain terminal
430 gate
500 source/drain implant region
502 source/drain implant region
504 substrate layer
506 contact
508 contact
510 electrode
512 contact
600 pixel
602 photodetector
604 transfer gate
606 charge-to-voltage conversion region
700 pixel
702 photodetector
704 photodetector
706 transfer gate
708 transfer gate
710 charge-to-voltage conversion region
712 contact
714 source/drain contact implant
800 pixel
802 photodetector
804 photodetector
806 photodetector
808 photodetector
810 transfer gate
812 transfer gate
814 transfer gate
816 transfer gate
818 charge-to-voltage conversion region
820 contact
900 image sensor
902 photodetector
904 threshold implant
906 well
908 pad oxide
910 transfer gate
912 substrate layer
914 conversion region gap
1000 resist layer
1002 surface of substrate layer
1100 dopant implant
1102 lightly doped drain
1104 charge-to-voltage conversion region
1106 doped region in transfer gate
1200 conformal dielectric layer
1202 masking conformal dielectric layer
1300 sidewall spacer
1400 resist layer 1402 opening
1404 dopant implant
1406 source/drain implant region
1600 masking conformal dielectric layer
1602 image sensor
1800 resist layer
1802 opening
1804 dopant implant
1806 source/drain implant region
2000 image sensor
2002 conformal dielectric layer
2004 conformal dielectric layer
2006 masking conformal dielectric layer
2008 sidewall spacer
2100 resist layer
2102 image sensor
2104 opening
2200 dopant implant
2202 source/drain implant region

The invention claimed is:

1. A method for fabricating an image sensor, wherein the image sensor comprises a plurality of pixels each pixel including a photodetector, wherein the pixels are arranged such that two adjacent pixels share a common charge-to-voltage conversion region, the method comprising:

forming a plurality of transfer gates over a surface of the substrate layer, wherein a transfer gate is disposed between a respective shared charge-to-voltage conversion region and each photodetector associated with the shared charge-to-voltage conversion region and the transfer gates associated with each shared charge-to-voltage conversion region are spaced apart a predetermined distance to form a conversion region gap;

depositing a masking conformal dielectric layer over the image sensor, wherein the masking conformal dielectric layer is continuous and covers the plurality of transfer gates and each photodetector associated with the shared charge-to-voltage conversion region and fills each conversion region gap;

etching the masking conformal dielectric layer to form sidewall spacers along an outside edge of each transfer gate, wherein a portion of the masking conformal dielectric layer remains in each conversion region gap and is disposed over the entire surface of the substrate layer in each conversion region gap; and implanting an implant region in the plurality of transfer gates and the masking conformal dielectric layer in each conversion region gap masks the implant so that each charge-to-voltage conversion region is substantially devoid of the implant region.

2. The method as in claim 1, further comprising depositing a conformal dielectric layer over the image sensor prior to depositing the masking conformal dielectric layer.

3. The method as in claim 2, wherein etching the masking conformal dielectric layer to form sidewall spacers along an outside edge of each transfer gate comprises etching the masking conformal dielectric layer and the conformal layer to form sidewall spacers along an outside edge of each transfer gate, wherein the masking conformal dielectric layer and the conformal layer fill the conversion region gap.

* * * * *